(12) United States Patent
Irfan et al.

(10) Patent No.: US 11,120,874 B2
(45) Date of Patent: Sep. 14, 2021

(54) ELECTRONIC MEMORY DEVICE AND A METHOD OF MANIPULATING THE ELECTRONIC MEMORY DEVICE

(71) Applicant: City University of Hong Kong, Kowloon (HK)

(72) Inventors: Muhammad Irfan, Kowloon (HK); Ray C. C. Cheung, Kowloon (HK); Zahid Ullah, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/671,669

(22) Filed: Nov. 1, 2019

(65) Prior Publication Data

US 2021/0134366 A1    May 6, 2021

(51) Int. Cl.
*G11C 15/04* (2006.01)
(52) U.S. Cl.
CPC .................................. *G11C 15/04* (2013.01)
(58) Field of Classification Search
CPC .. G11C 15/04; G06F 30/327; G01R 31/31919
See application file for complete search history.

(56) References Cited

U.S. PATENT DOCUMENTS

| | | | |
|---|---|---|---|
| 7,155,563 B1 | 12/2006 | Somasundaram | |
| 2017/0293703 A1* | 10/2017 | Titley | G06F 30/327 |
| 2018/0018257 A1* | 1/2018 | Miki | G06F 16/00 |
| 2020/0201603 A1* | 6/2020 | Kozuma | H01L 29/786 |

FOREIGN PATENT DOCUMENTS

WO    2011071273    6/2011

* cited by examiner

*Primary Examiner* — David Lam
(74) *Attorney, Agent, or Firm* — Renner, Kenner, Greive, Bobak, Taylor & Weber (57) ABSTRACT

An electronic memory device and a method of manipulating the electronic memory device. The electronic memory device includes a plurality of basic memory blocks connected together with a modular structure, wherein each of the basic memory blocks includes a plurality lookup tables (LUT) arranged to operate as an memory element for storing a plurality of bits of logic levels; and a plurality of registers each pairing up with a respective lookup table in the basic memory blocks; wherein the plurality of pairs of lookup tables and registers combine to form a pipelining memory structure.

11 Claims, 9 Drawing Sheets

ELECTRONIC MEMORY DEVICE AND A METHOD OF MANIPULATING THE ELECTRONIC MEMORY DEVICE

TECHNICAL FIELD

The present invention relates to an electronic memory device and a method for manipulating the electronic memory device, and particularly, although not exclusively, to an efficient ternary content-addressable memory.

BACKGROUND

Electronic data may be stored in electronic memory devices. In some applications which require a relatively high-speed throughput of the memory device, temporary memory devices such as random access memory (RAM) may be used, in which the speed of the read/write operation is extremely fast to facilitate the process of the data or signal of the entire system using the memory device.

In RAM devices, logic bits of "1" and "0" may be stored in semiconductor in form of charges or capacitance which may be "read" by detecting the high/low voltage level of each bit represented by each of the RAM unit in the device. In general, a RAM device comprises multiple memory storage units so to store multiple bits of data.

SUMMARY OF THE INVENTION

In accordance with a first aspect of the present invention, there is provided an electronic memory device comprising: a plurality of basic memory blocks connected together with a modular structure, wherein each of the basic memory blocks includes a plurality lookup tables (LUT) arranged to operate as a memory element for storing a plurality of bits of logic levels; and a plurality of registers each pairing up with a respective lookup table in the basic memory blocks; wherein the plurality of pairs of lookup tables and registers combine to form a pipelining memory structure.

In an embodiment of the first aspect, the plurality of lookup tables and the plurality of registers are provided in a plurality of configurable logic blocks.

In an embodiment of the first aspect, the plurality of configurable logic blocks are provided in a field programmable gate array (FPGA) device.

In an embodiment of the first aspect, the plurality of pairs of lookup tables and registers define a plurality of slices in the FPGA device.

In an embodiment of the first aspect, the plurality of registers includes a plurality of flip-flops.

In an embodiment of the first aspect, the plurality of flip-flops are connected between two stages of the pipelining memory structure.

In an embodiment of the first aspect, the two stages including a first stage of the plurality of basic memory blocks and a second stage of an AND operation logic gate.

In an embodiment of the first aspect, the memory device further comprises a priority encoder arranged to convert an output from the second stage to an address of data stored in the electronic memory device.

In an embodiment of the first aspect, the address is a matching address obtained in response to a searching operation.

In an embodiment of the first aspect, the memory element has a distributed random-access memory (RAM) structure.

In an embodiment of the first aspect, the distributed RAM structure comprises a plurality of LUTRAM each includes the plurality of LUTs in each of the slices in the FPGA device.

In an embodiment of the first aspect, each of the plurality of LUTRAM is a column memory of N cells and may operate as an N-bit RAM.

In an embodiment of the first aspect, the plurality of basic memory blocks combine to form a ternary content-addressable memory (TCAM) structure with a configuration of D×W, wherein D and W represent respectively the depth and the width of the TCAM structure.

In an embodiment of the first aspect, the plurality of basic memory blocks includes multiple blocks connected in a parallel form to increase the width of the TCAM structure.

In an embodiment of the first aspect, the plurality of basic memory blocks includes multiple blocks connected in a cascade form to increase the depth of the TCAM structure.

In accordance with a second aspect of the present invention, there is provided a method of manipulating an electronic memory device in accordance with the first aspect, comprising the steps of: configuring the FPGA device including assigning the LUTs in each of the slices to operate as the memory element; and assigning the flip-flops in each of the slices to pair up with the LUTs and operate as a plurality of pipeline registers in the memory structure.

In accordance with a third aspect of the present invention, there is provided a method of manipulating an electronic memory device in accordance with the first aspect, comprising the step of mapping data from a TCAM table into the electronic memory device including the plurality of basic memory blocks.

In an embodiment of the third aspect, the method further comprises the steps of: partitioning the TCAM table into a plurality of sub-tables; and mapping the plurality of sub-tables into corresponding basic memory blocks of the electronic memory device.

In an embodiment of the third aspect, the plurality of sub-tables includes m×n sub-tables, wherein m equals to a number of sub-tables in a column and n equals to a number of sub-tables in a row, and wherein m×n equals to the number of basic memory blocks in the electronic memory device.

In accordance with a fourth aspect of the present invention, there is provided a method of manipulating an electronic memory device in accordance with the first aspect, comprising the step of: providing an input search key to an input of the electronic memory device; dividing the input search key into a plurality of sub-words, wherein each of the sub-words are provided as address input of each of the plurality of basic memory blocks; generating a plurality of matchline vectors; converting the matchlines associated with the plurality of matchline vectors to a potential match address representing location of data stored in the electronic memory device matching with the input search key; and outputting the potential match address.

BRIEF DESCRIPTION OF THE DRAWINGS

Embodiments of the present invention will now be described, by way of example, with reference to the accompanying drawings in which.

DETAILED DESCRIPTION

The inventors have, through their own research, trials and experiments, devised that content-addressable memory (CAM) is a special type of associative array that performs parallel searching of the stored rules. It may return the address of the matched rule in one clock cycle. CAMs may be generally classified into two major types: binary CAM (BiCAM) supports only two memory states ('0' and '1') and ternary CAM (TCAM) supports three memory states ('0', '1', and 'X'), where the 'X' state may be considered as a "don't care bit" or wildcard.

Preferably, TCAM may be used in many applications where the searching speed is imperative, such as digital signal processing, artificial intelligence, translation lookaside buffers (TLBs) in soft processors, cache memory, and gene pattern recognition in bioinformatics. Packet classification and packet forwarding may maintain the high throughput of the system using TCAM in networking applications, e.g., software defined networks (SDNs).

Without wishing to be bound by theory, TCAM may be an essential element in modern networking applications where it provides the functionality of packet classification and packet forwarding in the form of implementing a routing table. FPGAs, having considerable amount of memory and logical resources, are extremely favorable for complex reconfigurable systems, e.g., software defined networks (SDNs). The presence of TCAM in FPGAs may be preferable for implementing such complex systems.

Figure 1:
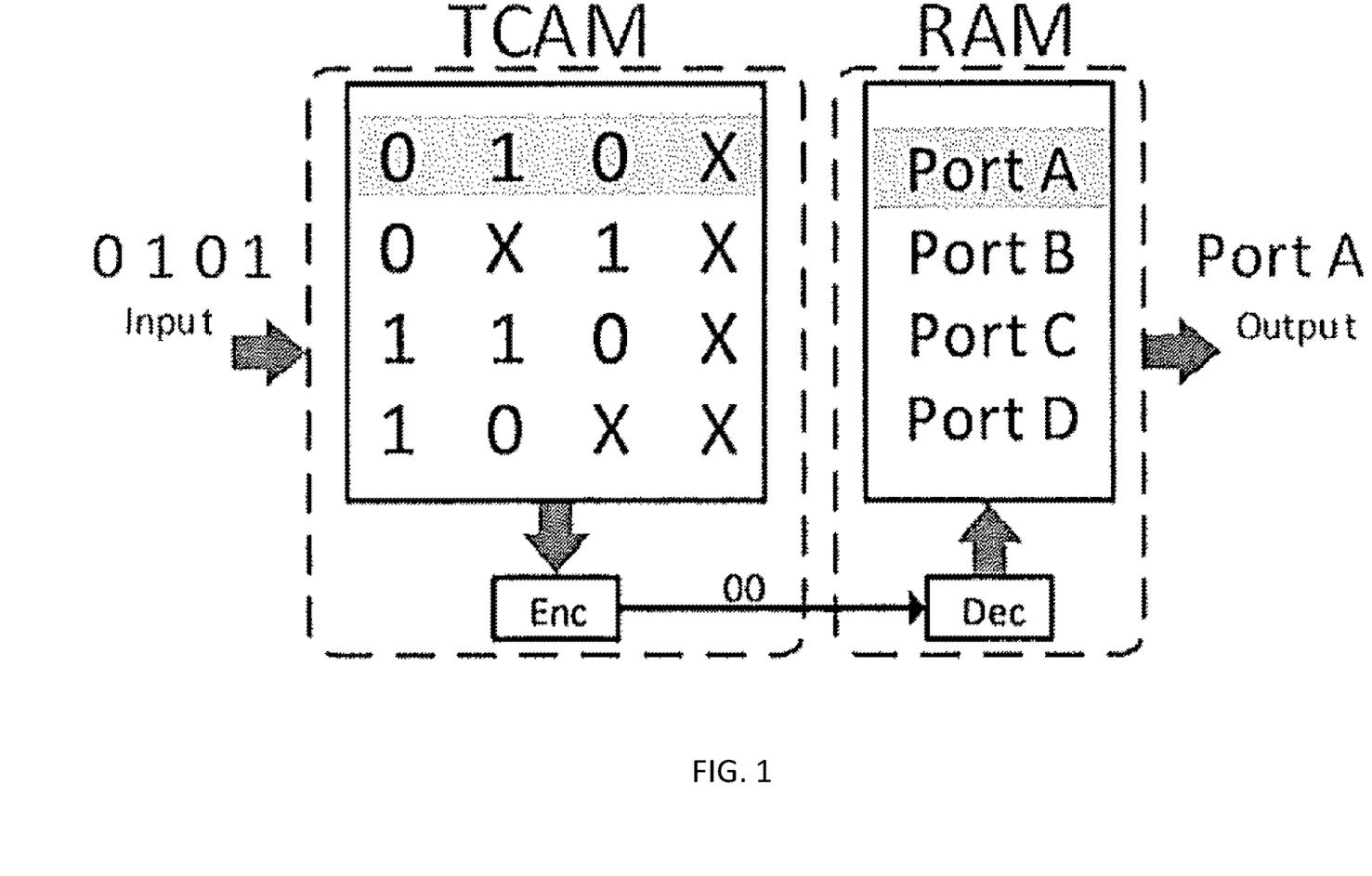
FIG. 1 is a block diagram showing an RAM/TCAM implementation of a routing table.

With reference to FIG. 1, a routing table may be maintained in the TCAM which stores the destination addresses and the ports to which the data packet needs to be forwarded. The router compares the destination address (e.g. "0 1 0 1") of the incoming packet with the stored addresses and chooses the appropriate port (Port A). The matchline of TCAM may act as a pointer to the corresponding word (Port number) in static random-access memory (SRAM).

Field-programmable gate arrays (FPGAs) provide a large amount of logic and memory components which makes them suitable for the application of emerging systems. The inventors devise that, although TCAM is vital element in networking applications, modern FPGAs may lack a hard core for TCAM because of its many other applications where TCAM would not be used. It was supported by some old FPGAs in the form of partial memory blocks and multi-function blocks (MFBs), but TCAM is not included in other example FPGAs. In one example embodiment, a TCAM may be needed for the implementation of networking system inside an FPGA.

Emulated TCAMs may be an alternative to utilize the hardware resources of FPGA to design a TCAM inside FPGAs. These FPGA may also provide soft cores for TCAM to support its applications, but the memory utilization may be inefficient in some examples. Some emulated TCAMs may support the SDNs however lack efficient usage of memory resources on FPGA.

For example, some FPGAs may not have a hard IP to support TCAM. Alternatively, emulated TCAMs may be used by utilizing the memory resources inside FPGAs, these emulated TCAMs may be considered as FPGA-based CAMs.

In some alternatively examples, TCAMs may be implemented based on application-specific integrated circuits (ASICs), however ASICs may be less preferable in some applications as these devices may have low storage density, less reconfigurable, and challenging to integrate with FPGA-based systems.

In one example embodiment, there is provided a novel TCAM architecture using distributed-RAM (D-TCAM) which outperforms exemplary FPGA-based TCAMs by efficiently utilizing the hardware resources. Preferably, the physical structure of FPGA slices may be utilized to improve the throughput of TCAM by introducing pipeline registers to the design.

On the other hand, the inventors devise that distributed RAM-based TCAM architectures may "waste" a large number of flip-flops (FFs) in FPGAs due to the LUT-FF pairs as it only needs LUTs to implement the memory device. This may be considered as inefficient utilization of memory resources. This problem may be solved by keeping in mind the hardware structure of FPGA slices and its other components which is explained later in this disclosure.

The third type of FPGA-based TCAMs is register-based TCAMs or gate-based TCAMs, which may use FFs to store the TCAM rules and perform parallel comparisons of each flip-flop with the input search key.

In this example, FFs in FPGA terminology are known as slice registers (SRs). Gate-based TCAMs reduces the hardware resources in terms of slices per TCAM bit but may lack scalability because of its high routing complexity. LH-CAM and G-AETCAM may be two examples implemented as 64×36 BiCAM and TCAM, respectively, on Xilinx FPGA. It may be preferable in terms of hardware resources and speed for small size TCAM, but for larger sizes, it may not be a good option to emulate TCAM on FPGA.

In one example embodiment, there is provided an electronic memory device comprising: a plurality of basic memory blocks connected together with a modular structure, wherein each of the basic memory blocks includes a plurality lookup tables (LUT) arranged to operate as an memory element for storing a plurality of bits of logic levels; and a plurality of registers each pairing up with a respective lookup table in the basic memory blocks; wherein the plurality of pairs of lookup tables and registers combine to form a pipelining memory structure.

In this embodiment, the memory device is implemented in a field programmable gate array (FPGA) device which contains multiple programmable components called configurable logic blocks (CLB). Once the CLBs are programmed, the FPGA may logically process electronic inputs and provide corresponding logic output as required. For example, the FPGA may utilize the programmed lookup tables in the device to process the input to determine the output, and provides the output logic as desired.

The following table lists the important terminologies used in the memory device according to embodiments of the present invention.

TABLE 1

Terminologies (Notations for D-TCAM)

| Notation | Definition |
| --- | --- |
| Sk | Search key (W bits) |
| W | Width of the D-TCAM |
| D | Depth of the D-TCAM |
| m | Number of D-CAM blocks in a column |
| n | Number of D-CAM blocks in a row |
| MLs | Match lines. Output of D-TCAM going into the priority encoder |
| ML_Vs | Match line vecotrs of 64 bits. Ouptput of each D-CAM block |
| Sw | Sub-word formed by dividing Sk into a 6-bit words |

Figure 2:
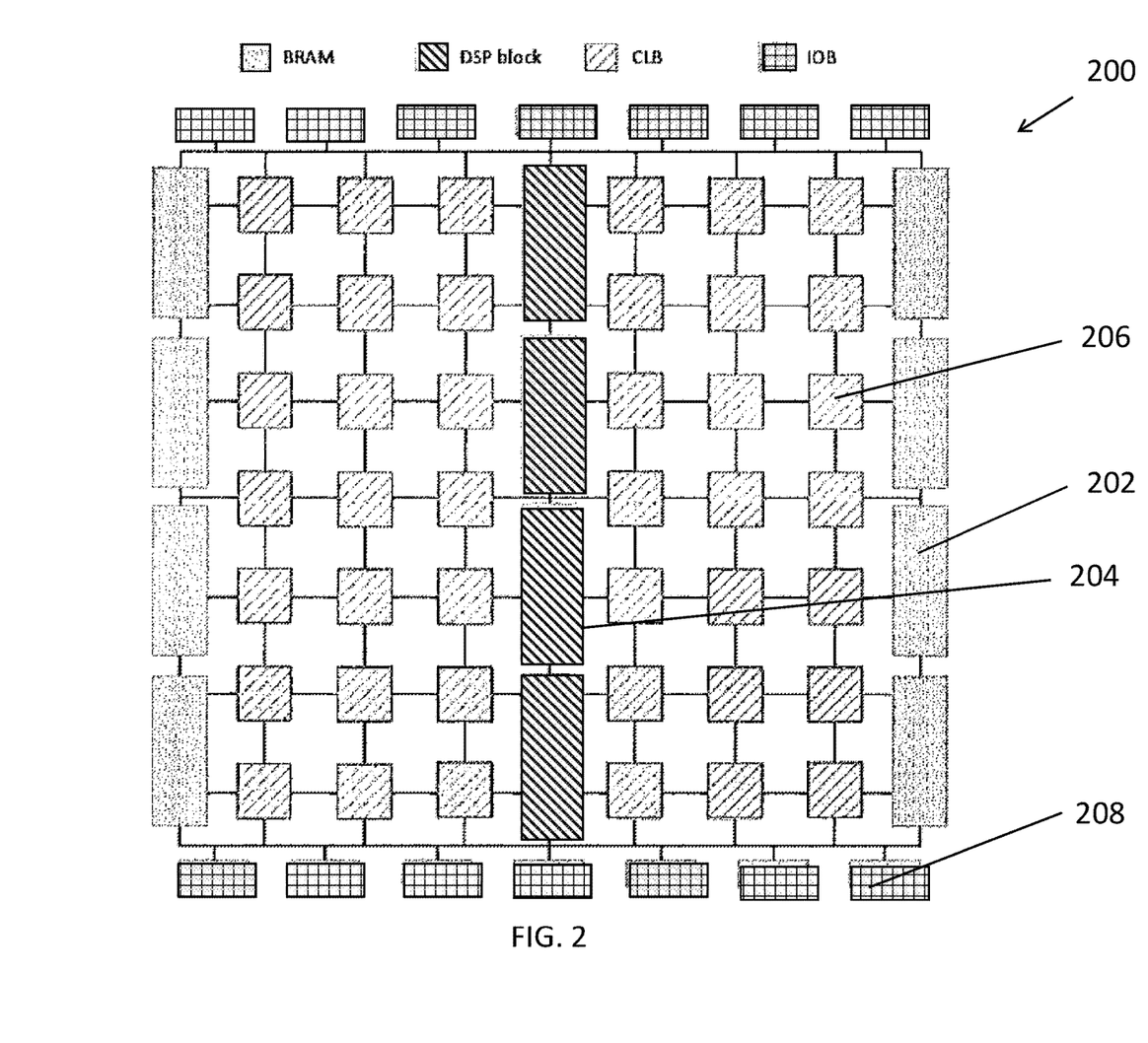
FIG. 2 is an illustration of an example FPGA device, which may be programmed to operate as an electronic memory device in accordance with an embodiment of the present invention.

FPGAs consist of reconfigurable hardware components, to implement any digital system, supported by the interconnection matrix. With reference to FIG. 2, an exemplary FPGA 200 may include block RAMs (BRAMs) 202, digital signal processing (DSP) blocks 204, configurable logic blocks (CLBs) 206, and input/output blocks (IOBs) 208.

Preferably, the lookup tables and the registers may be provided in a plurality of configurable logic blocks 206 in the FPGA 200, and the pairs of lookup tables and registers may further define a plurality of slices in the FPGA device 200.

For example, in some FPGA architectures, CLB 206 may consist of two types of slices; SLICEM and SLICEL. Each slice may include four lookup tables (LUTs) and eight flip-flops (also known as SRs). LUTs inside a SLICEL can be configured as a logic element which implements any function up to 6-inputs (using one LUT), and may operate as function generators. LUTs inside a SLICEM can be configured as a logic element as well as a memory element, and may be used as LUTRAMs.

Preferably, each LUTRAM may be a column memory of N cells which can be used as N-bit RAM. Multiple LUTRAMs combine to form a distributed RAM structure in a memory element. In one example, N=64 and therefore the LUTRAM may be a 64-bit RAM. Alternatively, N may be of other value in different memory structures.

Figure 3A:
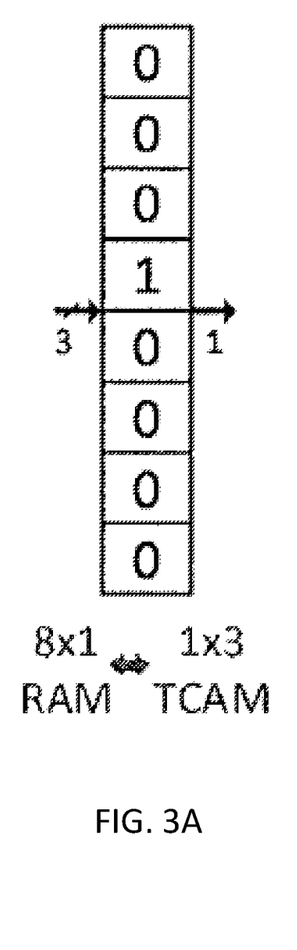
FIGS. 3A to 3E are illustrations of conversion of LUTRAMs into TCAMs based on different emulating rules.
Figure 3B:
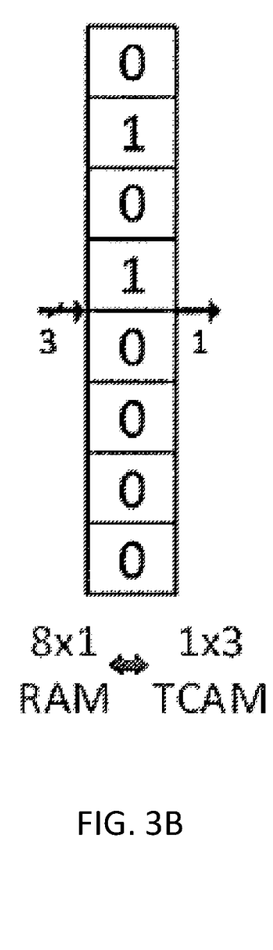

With reference to FIGS. 3A and 3B, a 3-input LUTRAM saves the information of 1×3 TCAM. The address input of the LUTRAM may be treated as search key (Sk) of 1×3 TCAM. Only those location(s) stores 'logic-1' whose address corresponds to the rule present in TCAM, otherwise 'logic-0' is stored. For instance, 3-input LUTRAM TCAM rules.

Figure 3C:
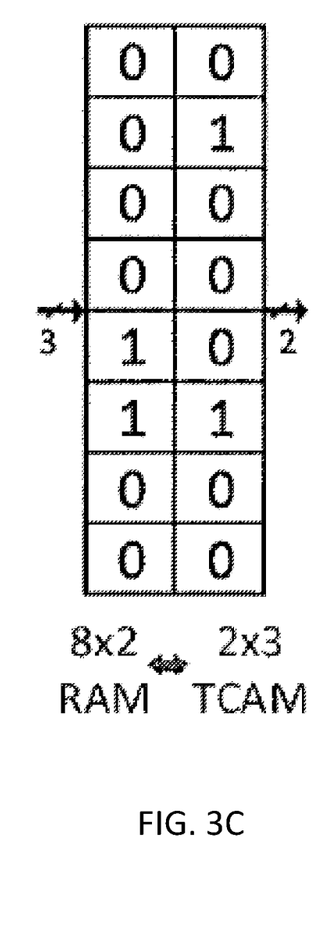
Figure 3D:
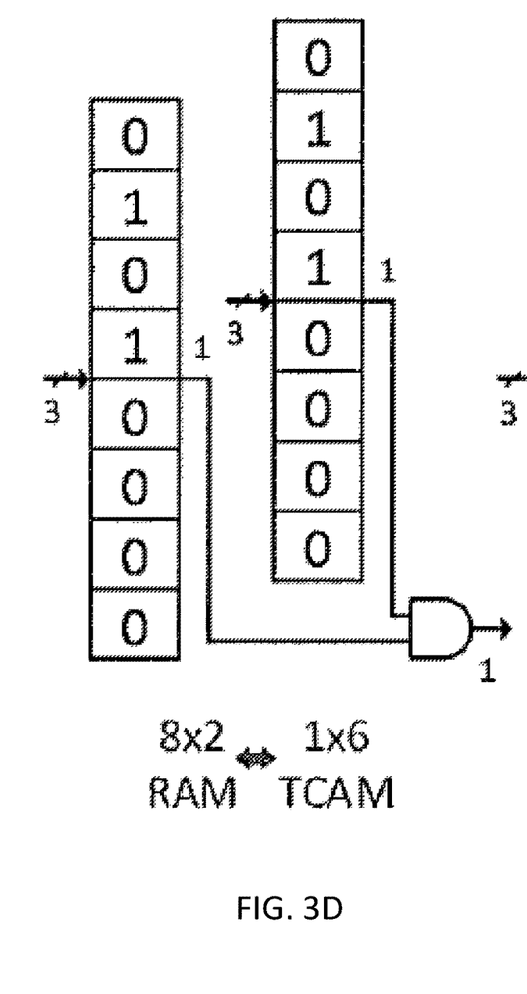

Similarly, referring to FIGS. 3C and 3D, two 3-input LUTRAMs may be connected in parallel, e.g. with outputs being "ANDed" (by connecting the outputs to an additional AND logic) to form 1×6 TCAM. With reference to FIG. 3D, the LUTRAMs stores "1 0 X 0 1 0" as one 6-input rule. The input search key (Sk) equal to "1 0 0 0 1 0" and "1 0 0 0 1 0" matches with the stored rule to provide matchline (ML) equal to 'logic-1' as output.

Figure 3E:
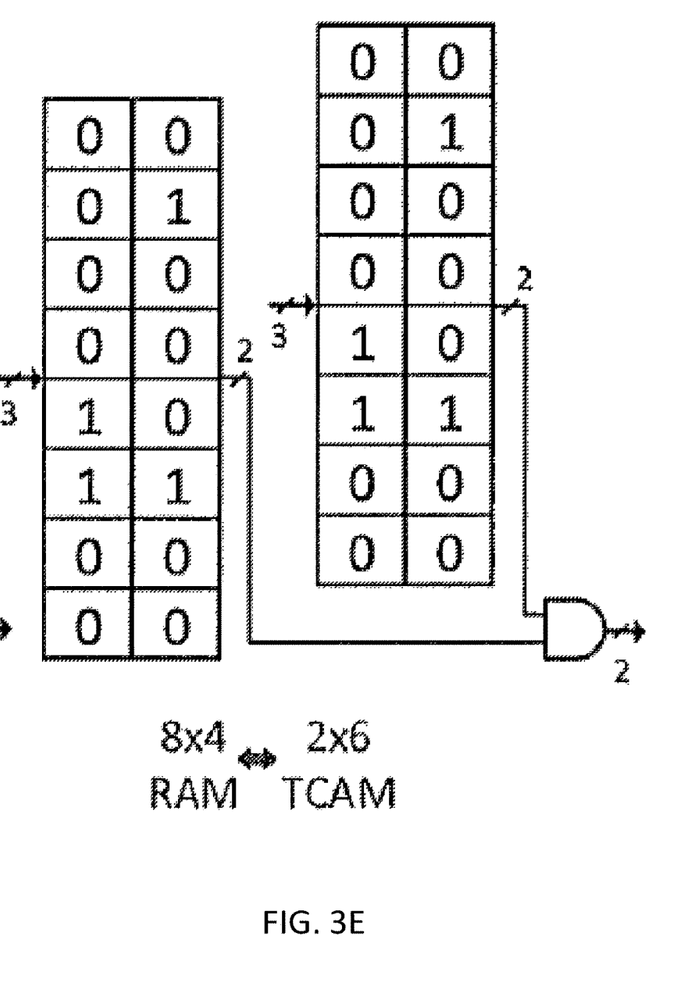

Four 3-input LUTRAMs are connected such that two LU-TRAMs in parallel and two in cascade form to emulate a 2×6 TCAM. In FIG. 3E two TCAM rules of 6 bits each ("1 0 0 X 1 0" and "1 X X 0 0 1") are stored.

To simplify the understanding, the emulation of LUTRAMs into TCAM may be explained using 3-input LUTRAMs. FPGAs may have 6-input LUTRAM, such as in those Xilinx FPGAs. In this example TCAM design, 6-input may saves information of 1×6 TCAM in a similar way as described for 3-input LUTRAM of FIG. 3A. For example, a basic memory block including a D-CAM block may include 64 6-input LUTRAMs which implements a 64×6 TCAM. In addition, multiple basic memory blocks, i.e., the D-CAM blocks, may be connected together to form a modular structure of larger TCAMs similarly as described for multiple 3-input LUTRAMs in cascade and/or parallel form, referring to FIG. 3E for example.

Preferably, the D-CAM block is the basic building block of the D-TCAM architecture. In one preferable embodiment, one D-CAM block consists of 64 6-input lookup tables (LUTs). These LUTs may be provided by the SLICEM slices of Xilinx FPGAs, which are also known as LUTRAMs.

Figure 4A:
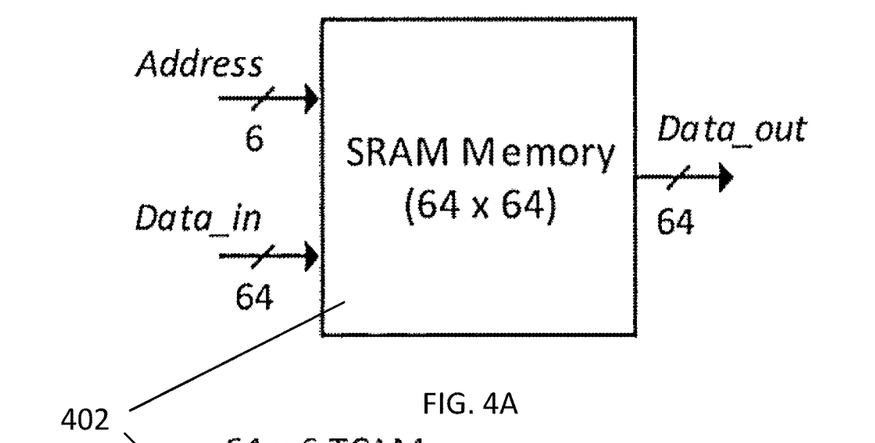
FIGS. 4A and 4B are block diagrams showing a building block of D-TCAM.

With reference to FIG. 4A, there is shown a D-CAM block 402 which is a distributed memory of 64×64 consisting of 64 LUTRAMs. All of the memory locations can be read and write using the "Address" and "Data in" as inputs, and "Data out" as the output of the basic memory block (D-CAM) 402. The same memory as shown in FIG. 4A may be used in FIG. 4B with a priority encoder 404, and is changed into a TCAM memory 400.

Figure 4B:
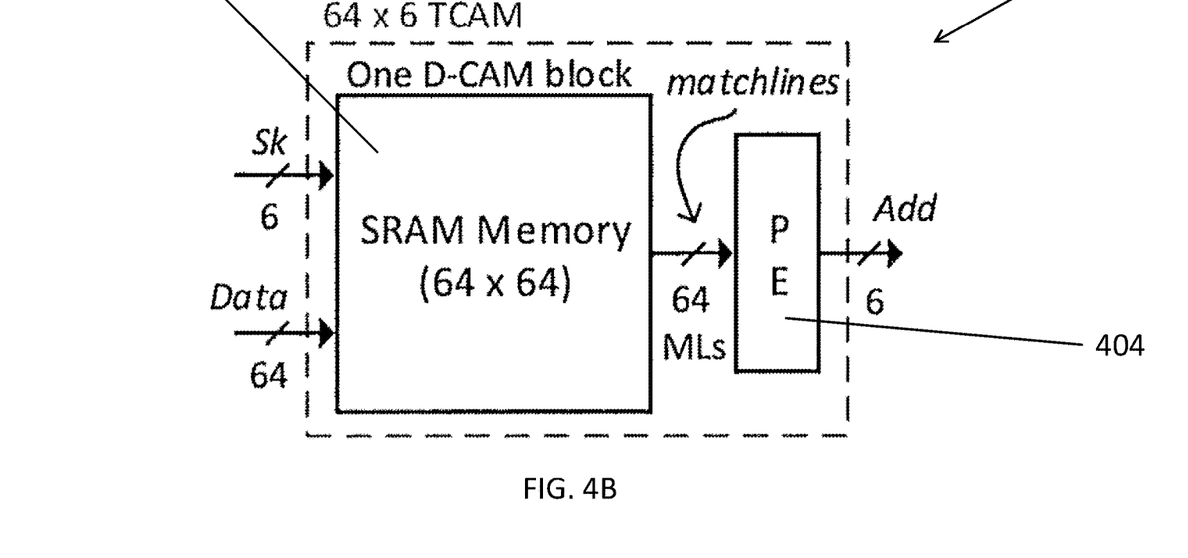

In this example, the address in FIG. 4A represents the search key (Sk) of TCAM memory 404 in FIG. 4B. Data out in FIG. 4A represents the matchlines (MLs) of TCAM memory 400 in FIG. 4B. Preferably, a priority encoder 404 may be used to translate matchlines into an address where the input search key is found.

Preferably, the plurality of basic memory blocks may combine to form a ternary content-addressable memory (TCAM) structure with a configuration of D×W, wherein D and W represent respectively the depth and the width of the TCAM structure. For example, each basic D-CAM block implements 48 bytes of TCAM with configuration as 64×6, where 64 is the depth (D) of TCAM and 6 is the width (W) of TCAM. As discussed earlier, the size of the TCAM may be expanded or scaled, in which the basic memory blocks may include multiple blocks connected in a parallel form to increase the width of the TCAM structure, or in a cascade form to increase the depth of the TCAM structure.

Figure 5A:
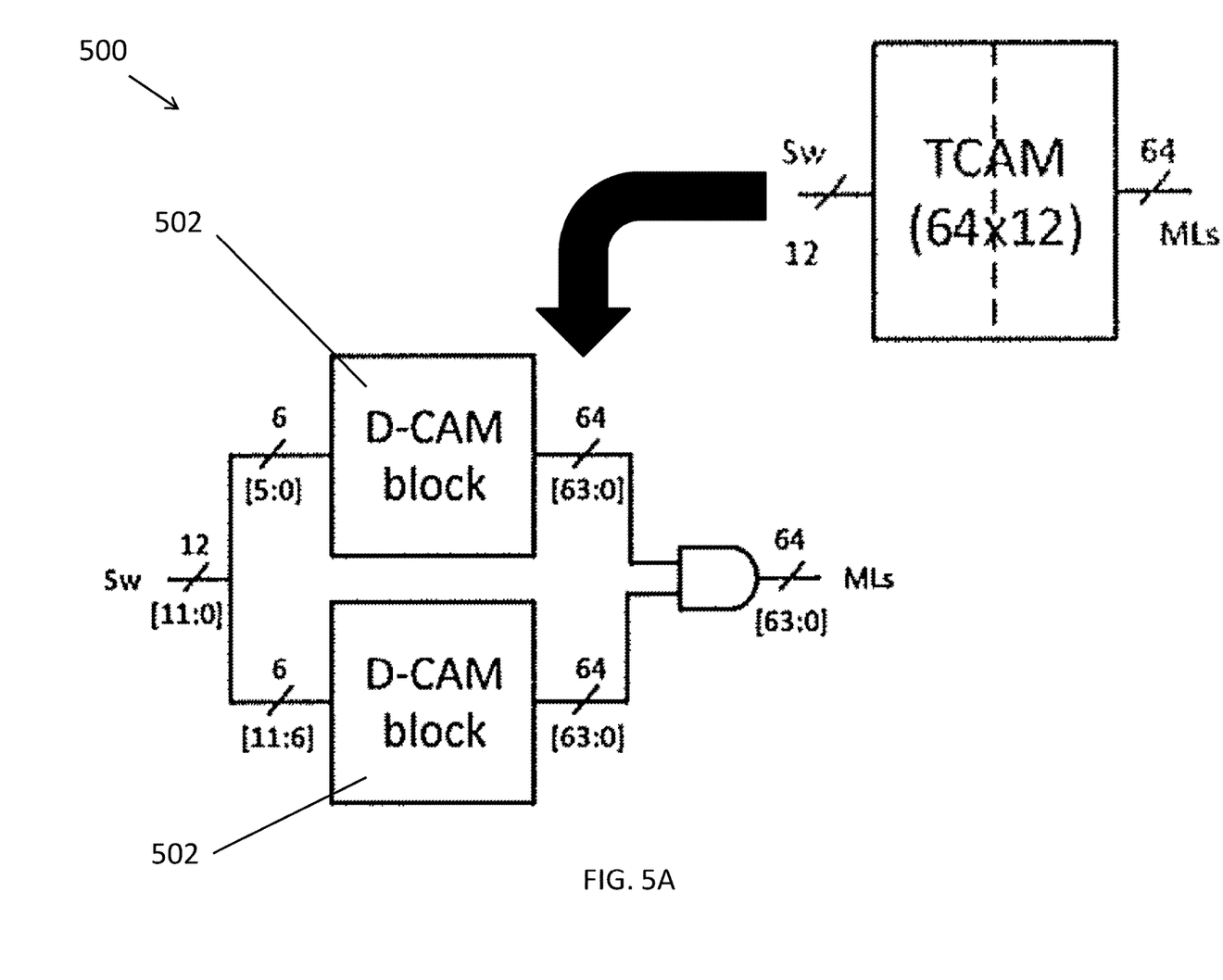
FIGS. 5A and 5B are illustrations showing expansions of D-TCAM using two D-CAM blocks connected in parallel form or in cascade form.
Figure 5B:
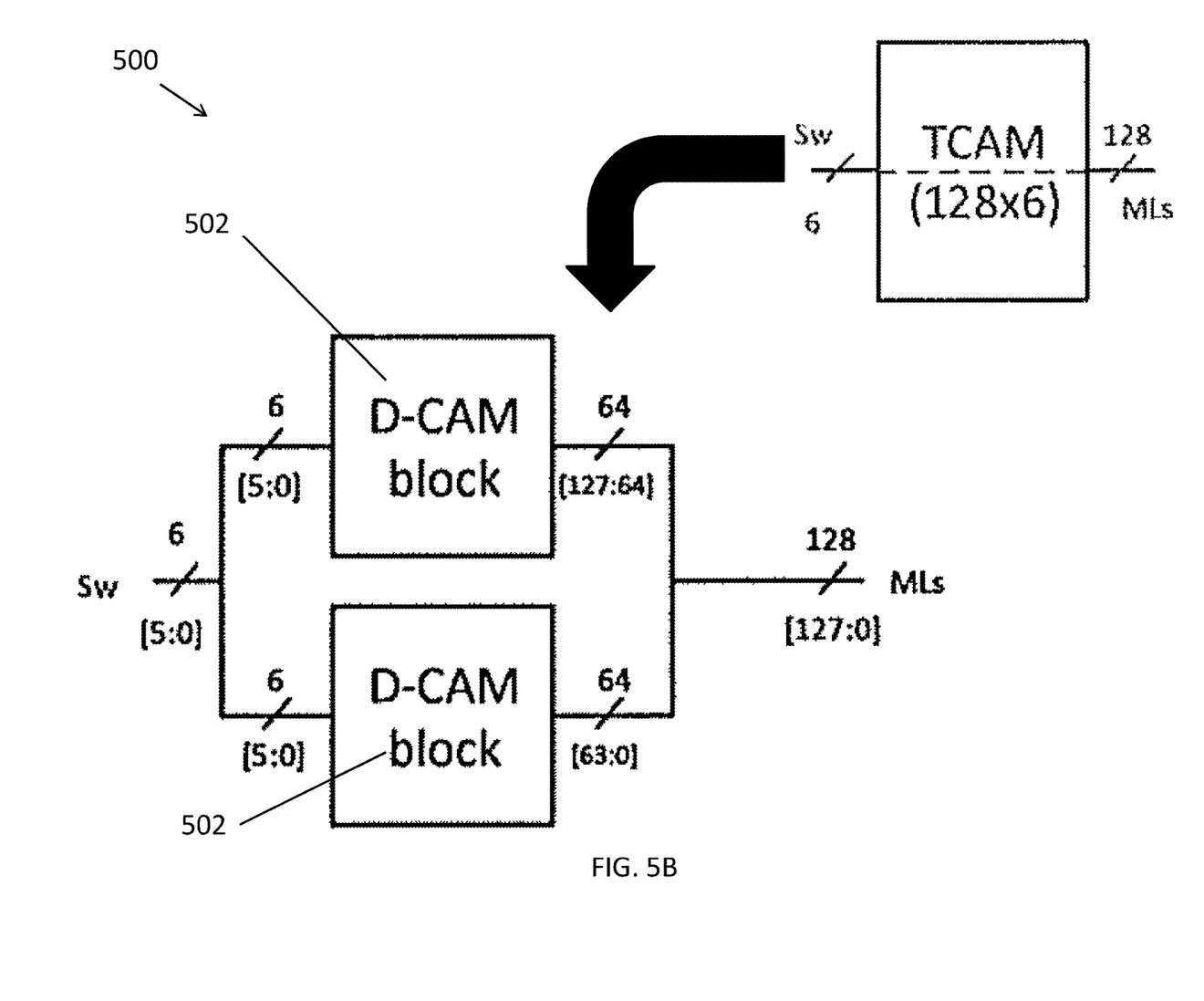

With reference to FIG. 5A, increasing the width of TCAM from 6 bits to 12 bits requires an additional D-CAM block by keeping the depth of TCAM constant. Alternatively, referring to FIG. 5B, increasing the depth of TCAM from 64 to 128 requires an additional D-CAM block by keeping the width of TCAM constant. In these two examples, horizontal expansion of D-CAM blocks 502 is done to increase the width while the vertical expansion of D-CAM blocks is done to increase the depth of emulated D-TCAM 500.

Figure 6:
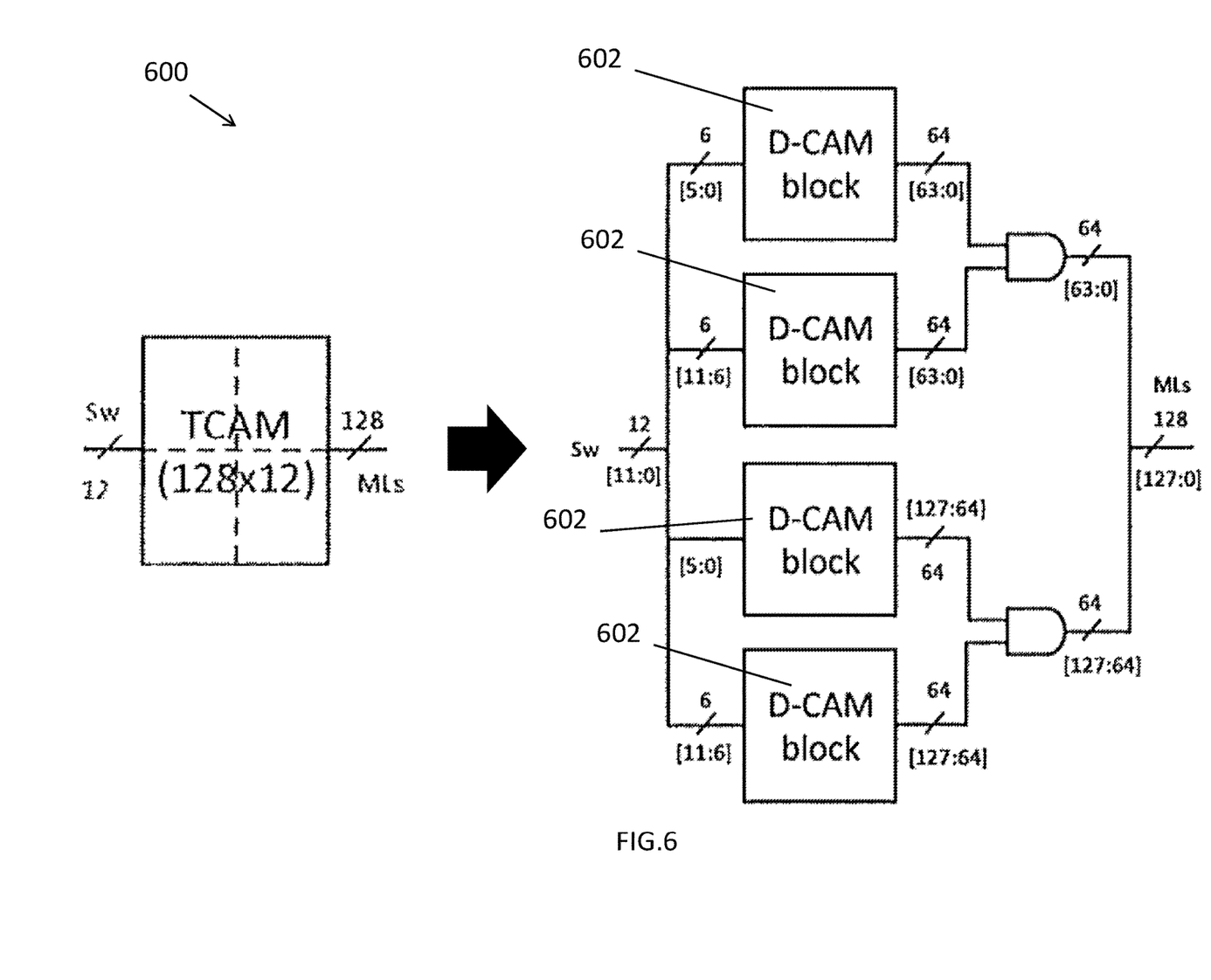
FIG. 6 is an illustration showing horizontal and vertical expansion of a D-TCAM using four D-CAM blocks.

In another example, with reference to FIG. 6, expansion in both directions may be performed to create the desired size configuration of TCAM on FPGAs. For example, a formation of 128×12 TCAM 600 may be obtained using four D-CAM blocks 602 connected in both parallel and cascade form. Similarly, by further expanding the TCAM structure, a D-TCAM of size 512×144 may be emulated using 192 D-CAM blocks connected in parallel and cascade form.

As discussed above, FPGA's hardware components may be utilized in the form of slices (or CLBs), BRAMs, DSP blocks, and I/O blocks to synthesize any digital design. Preferably, LUTs and FFs may be arranged as LUT-FF pair inside the slices. They may not be used independently. For example, if a digital design requires 200 LUTs but not any FF, the synthesizer will still assign 50 slices to it, which contains FFs as well. In this example, the 200 FFs are utilized (synthesized/inferred) by the digital design but are not used, which is a wastage of area in FPGA.

In some example TCAM structures which are based on distributed RAM using LUTRAMs, these structures may only need LUTs from the LUT-FF pairs inside a slice. A large number of LUT-FF pairs are inferred by the synthesizer in the form of slices to implement the distributed RAM-based TCAM designs. LUTs are needed by these design, but FFs are not.

However, due to the LUT-FF pair nature of FPGA, FFs are also inferred by the synthesizer while they are not part of the design. It is a waste of area on the reconfigurable device, i.e., FPGA. These FFs may be considered as redundant flip-flops.

In one example embodiment, there is provided a method for manipulating an electronic memory device such as an FGPA or an FPGA-based memory device. The method comprises the steps of: configuring the FPGA device including assigning the LUTs in each of the slices to operate as the memory element; and assigning the flip-flops in each of the slices to pair up with the LUTs and operate as a plurality of pipeline registers in the memory structure.

In this embodiment, the flip-flops in the slices are assigned for pipelining. Advantageously, the memory device may be programmed according to the available hardware in FPGA to efficiently utilize the area and hardware resources, and redundantly inferred FFs of the LUT-FF pairs for pipelining.

By exploiting the LUT-FF pair nature of the hardware resources inside FPGAs, the available hardware resources may be efficiently utilized. Preferably, these redundant flip-flops may be assigned as pipeline registers which combine with the LUT in the slices to form a pipelining memory structure, and improved the throughput of the TCAM design.

Figure 7:
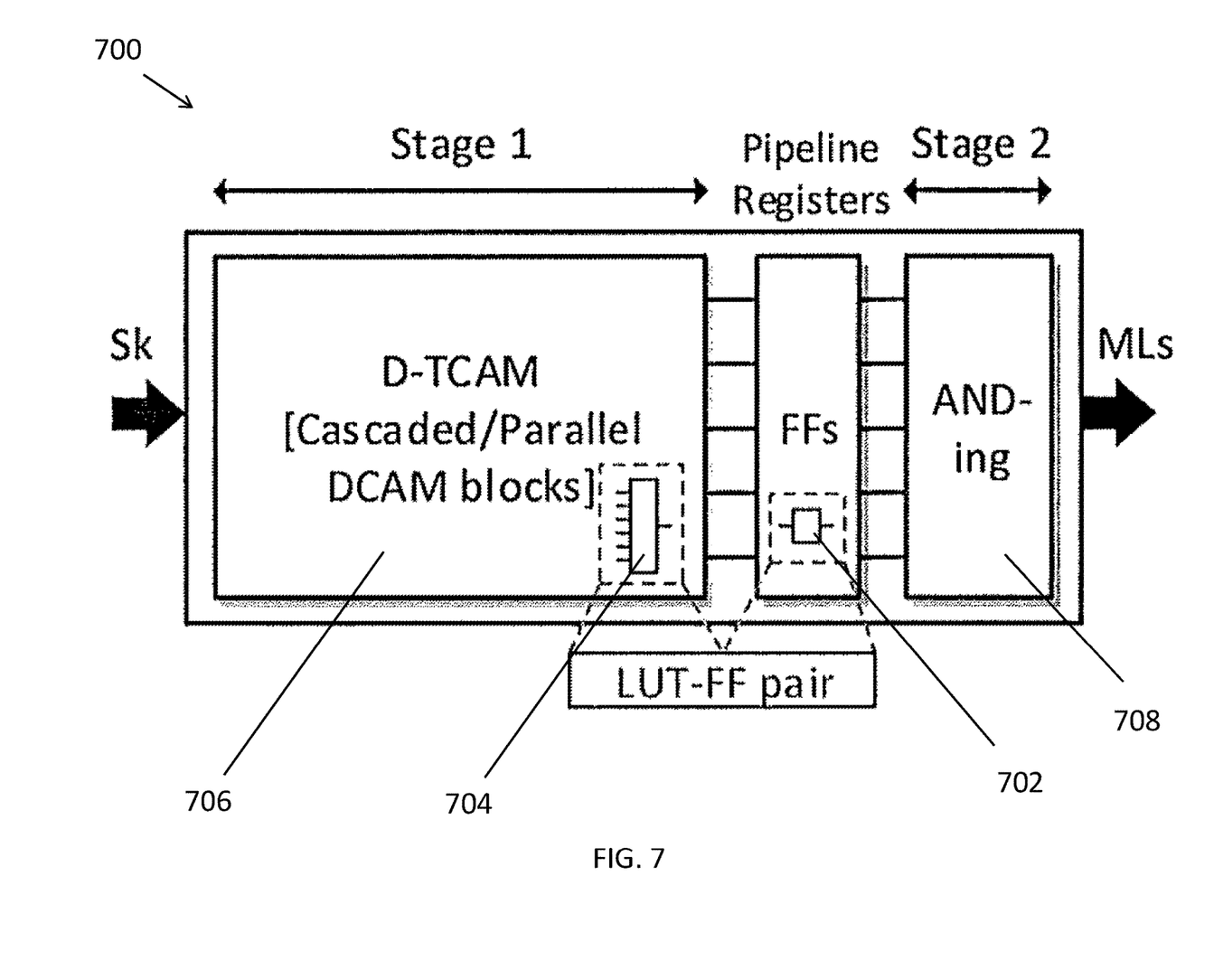
FIG. 7 is a schematic diagram showing LUT-FF pairs and the pipeline memory structure of the memory device in accordance with an embodiment of the present invention.

With reference to FIG. 7, the electronic memory device 700 comprises a plurality of registers 702 each pairing up with a respective lookup table 704 in the basic memory blocks 706, the plurality of pairs of lookup tables 704 in the D-TCAM memory blocks 706 as discussed earlier and registers 702 combine to form a pipelining memory structure. These registers are the flip-flops assigned to operate as pipeline registers 702. In the pipelining memory structure, flip-flops 702 are connected between two stages, including a first stage of the plurality of basic memory blocks 706 and a second stage of an AND operation logic gate 708.

Advantageously, pipelining in the digital system may improve the performance of the whole system, and throughput is improved in most of the cases. In the preferred TCAM design, the pipeline memory structure may be divided into two pipeline stages, separated from each other using pipeline registers. Referring to FIG. 7, the redundant FFs of each LUT-FF pair are used as pipeline registers.

In addition, the memory device saves the information about the presence of input search key as well as the address where it is found in LUTRAMs in an efficient way to reduce the number of SRAM cells per TCAM bit compared to other LUTRAM-based TCAMs. Similarly, the redundant FFs are used as pipeline registers to divide the TCAM design into two stages which improved the throughput.

Furthermore, in embodiments of the present invention, the number of slices utilized by the TCAM structure, either without pipelining or with pipelining, is basically same, but the performance may be improved in the latter case, i.e. with pipelining.

In one example embodiment, the electronic memory device may be further manipulated, by mapping data from a TCAM table into the electronic memory device including the plurality of basic memory blocks. Such mapping includes: partitioning the TCAM table into a plurality of sub-tables; and mapping the plurality of sub-tables into corresponding basic memory blocks of the electronic memory device.

Preferably, data from a TCAM table may be mapped into D-TCAM which consists of D-CAM blocks. Mapping of TCAM data into the emulated TCAM may be referred as "populating". In this populating operation, the plurality of sub-tables includes m×n sub-tables, wherein m equals to a number of sub-tables in a column and n equals to a number of sub-tables in a row, and wherein m×n equals to the number of basic memory blocks in the electronic memory device.

For example, the TCAM table may be partitioned into m rows and n columns of sub-tables according to the dimensions of D-CAM block, i.e., 64×6. Each row of the partitioned TCAM table consists of 64 rules while each column consists of 6 bits. The m×n sub-tables of TCAM may be mapped into the corresponding D-CAM blocks to form a D-TCAM of size D×W, where D is the depth of TCAM and W is the width of TCAM. In the example population operation as shown below, variable 't' represents the corresponding sub-table of TCAM mapping to D-CAM blocks of D-TCAM. Preferably, a total of m×n×64 LUTRAMs are required to implement D×W D-TCAM because each D-CAM block constitutes of 64 LUTRAMs.

Operation 1 Populating operation (D×W TCAM)

```
Input: TCAM Table (D × W)
Output: D-TCAM Table (m × n sub-tables)
1:   for t <- 0 to t m × n do
2:      for i <- 0 to i <- m do
3:         for j <- 0 to j <- n do
4:            D-CAM[i] [j] <= TCAM sub-table[t]
5:         end for
6:      end for
7: end for
   m × n: Total number of sub-tables in TCAM which is
   equal to the number of D-CAM blocks in D-TCAM
      m: Number of sub-tables in a column
      n: Number of sub-tables in a row
```

In this operation, the update latency of RAM-based TCAMs may be proportional to the depth of the utilized RAM blocks. Comparing BRAM-based TCAMs have a 513-clock cycle update latency, distributed-RAM based TCAMs in accordance with embodiments of the present invention have an update latency of only 65 clock cycles.

Yet in other example embodiment, there is provided a method of manipulating an electronic memory device, in particular a searching operation performed by the memory device. The method comprises the step of: providing an input search key to an input of the electronic memory device; dividing the input search key into a plurality of sub-words, wherein each of the sub-words are provided as address input of each of the plurality of basic memory blocks; generating a plurality of matchline vectors; converting the matchlines associated with the plurality of matchline vectors to a potential match address representing location of data stored in the electronic memory device matching with the input search key; and outputting the potential match address.

The searching operation is illustrated as follows:

Operation 2 Searching of D-TCAM for potential match

```
Input: Search key (Sk)
Output: m Matchline vectors (ML_Vs) of 64 bits each
which is converted to potential match address by PE.
    1: for i <- 0 to i <- n do
        sub-word [i] <= Sk [6 * n : (6 * n) + 5] ;
    2: end for
    3: for j <- 0 to j <- m do
        ML_V [j] <= D-CAM [j] [subword (0) ] AND
                   D-CAM [j] [subword (1) ] AND
                        .
                        .
                        .
                   D-CAM [j] [subword (n) ] ;
    4: end for
    5: PE <= ML_V [m:0]
        m: Number of sub-tables in a column
        n: Number of sub-tables in a row
        PE: A priority encoder which converts the
        matchline vectors into the potential match address
```

In this operation, the input search key (Sk) is divided into n 6-bit sub-words (Sw) and are provided to its corresponding n D-CAM blocks. Sw is searched in m D-CAM blocks in parallel to generate 64-bit matchline vectors (ML_Vs). The m ML_Vs from each of the n D-CAM blocks are ANDed to form m*64 matchlines (MLs) which are converted to an address by the priority encoder (PE).

The inventors also evaluated the performance of the memory device in accordance with embodiments of the present invention. In the experiment, the D-TCAM was implemented on Xilinx Virtex-6 FPGA for the size 512×144. In the experiment, the FPGA device XC6VLX760 is used with −2 speed grade.

A large number of TCAM dimensions were implemented by varying the depth (D) and width (W) of the emulated TCAM which proves the scalability and modular structure of the TCAM architecture.

Advantageously, speed of all emulated designs of D-TCAM is greater than the speed of the design without pipeline registers. The memory device of the present invention shows improvement in speed of TCAM without using additional hardware resources on FPGAs.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method of manipulating an electronic memory device having a plurality of basic memory blocks connected together with a modular structure, wherein each of the basic memory blocks includes a plurality lookup tables (LUT) arranged to operate as an memory element for storing a plurality of bits of logic levels; and a plurality of registers each pairing up with a respective lookup table in the basic memory blocks;

wherein the plurality of pairs of lookup tables and registers combine to form a pipelining memory structure;

wherein the plurality of lookup tables and the plurality of registers are provided in a plurality of configurable logic blocks;

wherein the plurality of pairs of lookup tables and registers define a plurality of slices in the FPGA device;

wherein the plurality of registers includes a plurality of flip-flops;

wherein the plurality of flip-flops are connected between two stages of the pipelining memory structure;

wherein the two stages including a first stage of the plurality of basic memory blocks and a second stage of an AND operation logic gate, the electronic memory device comprises a priority encoder arranged to convert an output from the second stage to an address of data stored in the electronic memory device;

the method of manipulating the electronic memory device comprises the step of:

providing an input search key to an input of the electronic memory device;

dividing the input search key into a plurality of sub-words, wherein each of the sub-words are provided as address input of each of the plurality of basic memory blocks;

generating a plurality of matchline vectors;

converting the matchlines associated with the plurality of matchline vectors to a potential match address representing location of data stored in the electronic memory device matching with the input search key; and outputting the potential match address.

2. The method of claim 1, wherein the memory element has a distributed random-access memory (RAM) structure.

3. The method of claim 2, wherein the distributed RAM structure comprises a plurality of LUTRAM each includes the plurality of LUTs in each of the slices in the FPGA device.

4. The method of claim 3, wherein each of the plurality of LUTRAM is a column memory of N cells and may operate as an N-bit RAM.

5. The method of claim 1, wherein the plurality of basic memory blocks combine to form a ternary content-addressable memory (TCAM) structure with a configuration of D×W, wherein D and W represent respectively the depth and the width of the TCAM structure.

6. The method of claim 5, wherein the plurality of basic memory blocks includes multiple blocks connected in a parallel form to increase the width of the TCAM structure.

7. The method of claim 6, further comprising the step of mapping data from a TCAM table into the electronic memory device including the plurality of basic memory blocks.

8. The method of claim 7, further comprising the steps of:
partitioning the TCAM table into a plurality of sub-tables; and
mapping the plurality of sub-tables into corresponding basic memory blocks of the electronic memory device.

9. The method of claim 8, wherein the plurality of sub-tables includes m×n sub-tables, wherein m equals to a number of sub-tables in a column and n equals to a number of sub-tables in a row, and wherein m×n equals to the number of basic memory blocks in the electronic memory device.

10. The method of claim 5, wherein the plurality of basic memory blocks includes multiple blocks connected in a cascade form to increase the depth of the TCAM structure.

11. The method of claim 1, further comprising the steps of:
configuring the FPGA device including assigning the LUTs in each of the slices to operate as the memory element; and
assigning the flip-flops in each of the slices to pair up with the LUTs and operate as a plurality of pipeline registers in the memory structure.

* * * * *